US007214104B2

(12) United States Patent
Minich et al.

(10) Patent No.: US 7,214,104 B2
(45) Date of Patent: May 8, 2007

(54) BALL GRID ARRAY CONNECTOR

(75) Inventors: Steven E. Minich, York, PA (US); Donald K. Harper, Jr., Camp Hill, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 10/940,433

(22) Filed: Sep. 14, 2004

(65) Prior Publication Data

US 2006/0057897 A1 Mar. 16, 2006

(51) Int. Cl.
*H01R 11/502* (2006.01)
(52) U.S. Cl. ...................................... 439/701; 439/248
(58) Field of Classification Search ................ 439/701, 439/247, 248
See application file for complete search history.

(56) References Cited

U.S. PATENT DOCUMENTS

| | | | |
|---|---|---|---|
| 3,286,220 A | 11/1966 | Marley et al. ............... | 439/680 |
| 3,538,486 A | 11/1970 | Shlesinger, Jr. ............. | 439/268 |
| 3,669,054 A | 6/1972 | Desso et al. ................ | 113/119 |
| 3,748,633 A | 7/1973 | Lundergan ................... | 339/217 |
| 3,871,015 A | 3/1975 | Lin et al. ....................... | 357/67 |
| 4,076,362 A | 2/1978 | Ichimura ...................... | 339/75 |
| 4,159,861 A | 7/1979 | Anhalt ........................ | 339/75 |
| 4,260,212 A | 4/1981 | Ritchie et al. ................. | 339/97 |
| 4,288,139 A | 9/1981 | Cobaugh et al. .............. | 339/74 |
| 4,383,724 A | 5/1983 | Verhoeven ................... | 439/510 |
| 4,402,563 A | 9/1983 | Sinclair ....................... | 339/75 |
| 4,505,529 A | 3/1985 | Barkus ......................... | 339/17 |
| 4,545,610 A | 10/1985 | Lakritz et al. ................. | 29/589 |
| 4,560,222 A | 12/1985 | Dambach ..................... | 339/75 |
| 4,717,360 A | 1/1988 | Czaja ........................... | 439/710 |
| 4,776,803 A | 10/1988 | Pretchel et al. ................ | 439/59 |
| 4,815,987 A | 3/1989 | Kawano et al. .............. | 439/263 |
| 4,867,713 A | 9/1989 | Ozu et al. .................... | 439/833 |
| 4,900,271 A | 2/1990 | Colleran et al. ............. | 439/595 |
| 4,907,990 A | 3/1990 | Bertho et al. ................ | 439/851 |
| 4,973,271 A | 11/1990 | Ishizuka et al. ............. | 439/839 |
| 5,077,893 A | 1/1992 | Mosquera et al. ............ | 29/882 |
| 5,174,770 A | 12/1992 | Sasaki et al. ................ | 439/108 |

(Continued)

FOREIGN PATENT DOCUMENTS

EP 0 273 683 A2 7/1988

(Continued)

*Primary Examiner*—X. Chung-Trans
(74) *Attorney, Agent, or Firm*—Woodcock Washburn LLP

(57) ABSTRACT

An electrical connector having a leadframe assembly and a connector housing is disclosed. The leadframe may include a lead frame and an electrical contact extending at least partially through the lead frame. The connector housing contains the leadframe assembly in each of one or more directions and also allows the leadframe assembly to move relative to the housing in the each direction. After the connector is mounted to a substrate, such as a printed circuit board, the housing is free to move in at least one direction relative to the leadframe assemblies. The connector may also include a contact receiving wafer having a face that at least partially defines an aperture that extends therethrough. A terminal portion of the contact may extend at least partially into the aperture. The faces that define the aperture contain the terminal portion of the contact in each of a plurality of directions and also allows the terminal portion of the contact to move in each direction.

44 Claims, 6 Drawing Sheets

U.S. PATENT DOCUMENTS

| | | | |
|---|---|---|---|
| 5,238,414 A | 8/1993 | Yaegashi et al. | 439/108 |
| 5,254,012 A | 10/1993 | Wang | 439/263 |
| 5,274,918 A | 1/1994 | Reed | 29/882 |
| 5,302,135 A | 4/1994 | Lee | 439/263 |
| 5,320,549 A * | 6/1994 | Schempp et al. | 439/246 |
| 5,328,381 A * | 7/1994 | Seymour et al. | 439/247 |
| 5,431,578 A | 7/1995 | Wayne | 439/259 |
| 5,475,922 A | 12/1995 | Tamura et al. | 29/881 |
| 5,558,542 A | 9/1996 | O'Sullivan et al. | 439/682 |
| 5,590,463 A | 1/1997 | Feldman et al. | 29/844 |
| 5,609,502 A | 3/1997 | Thumma | 439/747 |
| 5,702,255 A * | 12/1997 | Murphy et al. | 439/71 |
| 5,730,609 A | 3/1998 | Harwath | 439/108 |
| 5,741,144 A | 4/1998 | Elco et al. | 439/101 |
| 5,741,161 A | 4/1998 | Cahaly et al. | 439/709 |
| 5,746,608 A | 5/1998 | Taylor | 439/70 |
| 5,795,191 A | 8/1998 | Preputnick et al. | 439/608 |
| 5,817,973 A | 10/1998 | Elco et al. | 174/32 |
| 5,873,742 A * | 2/1999 | McHugh | 439/74 |
| 5,908,333 A | 6/1999 | Perino et al. | 439/631 |
| 5,961,355 A | 10/1999 | Morlion et al. | 439/686 |
| 5,971,817 A | 10/1999 | Longueville | 439/857 |
| 5,975,921 A | 11/1999 | Shuey | 439/83 |
| 5,980,321 A | 11/1999 | Cohen et al. | 439/608 |
| 5,993,259 A | 11/1999 | Stokoe et al. | 439/608 |
| 6,050,862 A | 4/2000 | Ishii | 439/843 |
| 6,068,520 A | 5/2000 | Winings et al. | 439/676 |
| 6,095,827 A | 8/2000 | Dutkowsky et al. | 439/83 |
| 6,123,554 A | 9/2000 | Ortega et al. | 439/79 |
| 6,125,535 A | 10/2000 | Chiou et al. | 29/883 |
| 6,132,222 A * | 10/2000 | Wang et al. | 439/70 |
| 6,139,336 A | 10/2000 | Olson | 439/83 |
| 6,146,157 A | 11/2000 | Lenoir et al. | 439/101 |
| 6,146,202 A * | 11/2000 | Ramey et al. | 439/676 |
| 6,146,203 A | 11/2000 | Elco et al. | 439/608 |
| 6,171,149 B1 * | 1/2001 | van Zanten | 439/608 |
| 6,190,213 B1 | 2/2001 | Reichart et al. | 439/736 |
| 6,212,755 B1 | 4/2001 | Shimada et al. | 29/527.1 |
| 6,219,913 B1 | 4/2001 | Uchiyama | 29/883 |
| 6,220,896 B1 | 4/2001 | Bertoncici et al. | 439/608 |
| 6,259,039 B1 | 7/2001 | Chroneos, Jr. et al. | 174/263 |
| 6,269,539 B1 | 8/2001 | Takahashi et al. | 29/883 |
| 6,272,474 B1 | 8/2001 | Caletka et al. | 438/613 |
| 6,293,827 B1 | 9/2001 | Stokoe et al. | 439/608 |
| 6,319,075 B1 | 11/2001 | Clark et al. | 439/825 |
| 6,328,602 B1 | 12/2001 | Yamasaki et al. | 439/608 |
| 6,347,952 B1 | 2/2002 | Hasegawa et al. | 439/608 |
| 6,350,134 B1 | 2/2002 | Fogg et al. | 439/79 |
| 6,363,607 B1 | 4/2002 | Chen et al. | 29/883 |
| 6,371,773 B1 | 4/2002 | Crofoot et al. | 439/79 |
| 6,379,188 B1 | 4/2002 | Cohen et al. | 439/608 |
| 6,409,543 B1 | 6/2002 | Astbury, Jr. et al. | 439/608 |
| 6,431,914 B1 | 8/2002 | Billman | 439/608 |
| 6,435,914 B1 | 8/2002 | Billman | 439/608 |
| 6,461,202 B2 | 10/2002 | Kline | 439/701 |
| 6,471,548 B2 | 10/2002 | Bertoncini et al. | 439/608 |
| 6,506,081 B2 | 1/2003 | Blanchfield et al. | 439/682 |
| 6,537,111 B2 | 3/2003 | Brammer et al. | 439/857 |
| 6,540,522 B2 * | 4/2003 | Sipe | 439/61 |
| 6,543,129 B2 | 4/2003 | Cachina et al. | 29/843 |
| 6,551,112 B1 | 4/2003 | Li et al. | 439/66 |
| 6,554,647 B1 | 4/2003 | Cohen et al. | 439/607 |
| 6,572,410 B1 | 6/2003 | Volstorf et al. | 439/608 |
| 6,652,318 B1 | 11/2003 | Winings et al. | 439/608 |
| 6,663,426 B2 | 12/2003 | Hasircoglu et al. | 439/608 |
| 6,692,272 B2 | 2/2004 | Lemke et al. | 439/108 |
| 6,702,594 B2 | 3/2004 | Lee et al. | 439/83 |
| 6,739,918 B2 * | 5/2004 | Cohen et al. | 439/701 |
| 6,743,037 B2 | 6/2004 | Kassa et al. | 439/342 |
| 6,746,278 B2 | 6/2004 | Nelson et al. | 439/608 |
| 6,899,548 B2 * | 5/2005 | Houtz | 439/71 |
| 2003/0013330 A1 | 1/2003 | Takeuchi | 439/83 |
| 2003/0143894 A1 | 7/2003 | Kline et al. | 439/608 |
| 2003/0220021 A1 | 11/2003 | Whiteman, Jr. et al. | 439/608 |
| 2004/0183094 A1 | 9/2004 | Caletka et al. | 257/178 |
| 2005/0215121 A1 | 9/2005 | Tokunaga | 439/608 |
| 2006/0057897 A1 | 3/2006 | Minich et al | 439/701 |

FOREIGN PATENT DOCUMENTS

| | | |
|---|---|---|
| JP | 06-236788 | 8/1994 |
| JP | 07-114958 | 5/1995 |
| JP | 2000-003743 | 1/2000 |
| JP | 2000-003744 | 1/2000 |
| JP | 2000-003745 | 1/2000 |
| JP | 2000-003746 | 1/2000 |
| WO | WO 01/29931 A1 | 4/2001 |
| WO | WO 01/39332 A1 | 5/2001 |

\* cited by examiner

BALL GRID ARRAY CONNECTOR

CROSS-REFERENCE TO RELATED APPLICATIONS

The subject matter disclosed and claimed herein is related to the subject matter disclosed and claimed in U.S. patent application Ser. No. 10/294,966, filed Nov. 14, 2002, which is a continuation-in-part of U.S. patent applications Ser. No. 09/990,794, filed Nov. 14, 2001, now U.S. Pat. No. 6,692,272, and Ser. No. 10/155,786, filed May 24, 2002, now U.S. Pat. No. 6,652,318.

The subject matter disclosed and claimed herein is related to the subject matter disclosed and claimed in U.S. patent applications Ser. No. 10/940,329, filed Sep. 14, 2004, and Ser. No. 10/634,547, filed Aug. 5, 2003.

The contents of each of the above-referenced U.S. patents and patent applications is herein incorporated by reference in its entirety.

FIELD OF THE INVENTION

Generally, the invention relates to electrical connectors. More particularly, the invention relates to ball grid array ("BGA") connectors that allow for relative movement between the connector housing and lead frame assemblies contained within the housing, even after the connector is connected to a substrate such as a printed circuit board.

BACKGROUND OF THE INVENTION

Printed circuit boards ("PCBs") are commonly used to mount electronic components and to provide electrical interconnections between those components and components external to the PCB. One problem with conventional PCBs is flexing. PCBs flex under the weight of attached electrical components when subject to vibrations, assembly, and handling loads. Ultimately, the PCB with attached electrical components are assembled in a chassis, such as in a computer system. Handling and transit of the chassis assembly can cause PCB flexing under the weight of the components.

Additionally, electrical components are becoming increasingly heavy. Electrical components that are attached to the PCB include, among others, the heat sink and fan assembly which is attached to the central processing unit (CPU). These assemblies often are upwards of a pound or more in weight, putting an increased burden on the PCB.

In an effort to increase electrical component density on the PCB, electrical components may be attached to the PCB using BGA technology. A BGA microprocessor, for example, makes its electrical connection via a solder ball on each connector of the BGA of the electrical microprocessor and the electrical contacts on the surface of the PCB. BGA components require a rigid substrate to which they are attached. In effect, these BGA components are soldered directly to the circuit board without intervening contacts or wires. BGA components commonly incorporate tens or hundreds of solder connections between the ball-grid package and the circuit board. Any appreciable circuit board flexing may cause the solder connections to shear, compress, fatigue, and subsequently break.

There is a significant need in the art to provide a BGA connector that has the ability to flex under various loads to minimize stresses imposed on the solder ball connections.

SUMMARY OF THE INVENTION

An electrical connector according to the invention may include a leadframe assembly and a connector housing. The leadframe assembly may include a lead frame and an electrical contact extending at least partially through the lead frame. The housing contains the leadframe assembly in one or more directions and also allows the leadframe assembly to move relative to the housing in one or more directions. The housing and leadframe assemblies may move relative to one another even after the connector is mounted to a printed circuit board. An electrical connector according to the invention may be used in back panel applications, for example.

The leadframe assembly may include a tab extending therefrom via which the leadframe is contained by the housing. The tab may extend from the lead frame, or from the electrical contact. The connector housing may include a tab receptacle that defines an opening into which the tab extends. To allow for movement of the tab within the opening, the opening may be larger than the cross-sectional area of the tab. The tab receptacle may be resilient to facilitate insertion of the leadframe assembly into the housing.

The connector may also include a contact receiving wafer having an aperture that extends therethrough. A terminal portion of the contact extends at least partially into the aperture. The aperture allows the terminal portion of the contact to move in one or more directions, and also contains the terminal portion in each direction.

A solder ball may be connected to the terminal portion of the contact. The solder ball may have a diameter that is larger than the width of the aperture. Thus, the wafer may be contained between the solder ball and the lead frame, and movement of the contact into the aperture may be restricted.

DETAILED DESCRIPTION OF ILLUSTRATIVE EMBODIMENTS

FIGS. 1A and 1B depict an example embodiment of a ball grid array ("BGA") connector 100 according to the invention having a ball grid side 100A (best seen in FIG. 1A) and a receptacle side 100B (best seen in FIG. 1B). Though the connector described herein is depicted as a ball grid array connector, it should be understood that through pin mounting or surface mounting other than BGA may also be used. As shown, the BGA connector 100 may include a housing 101, which may be made of an electrically insulating material, such as a plastic, for example, that defines an internal cavity. The housing 101 may contain one or more insert molded lead frame assemblies ("IMLAs") 115. In an example embodiment, the housing 101 may contain ten IMLAs 115, though it should be understood that the housing 101 may contain any number of IMLAs 115.

Figure 2:
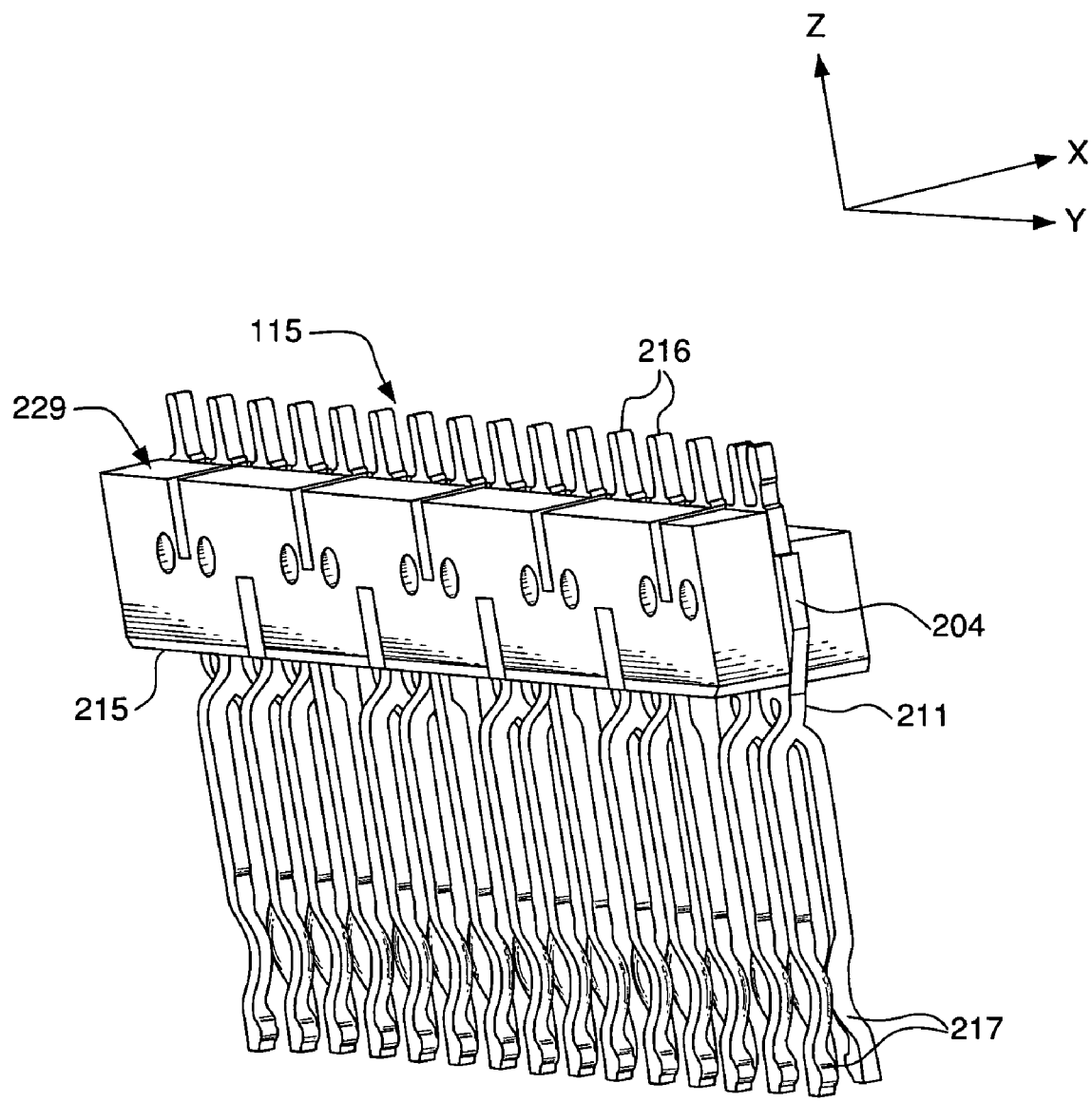
FIG. 2 depicts an example embodiment of an insert molded lead frame assembly according to the invention.

FIG. 2 depicts an example embodiment of an IMLA 115. As shown, the IMLA 115 may include a set of one or more electrically conductive contacts 211 that extend through an overmolded housing 215. The overmolded housing 215 may be made of an electrically insulating material, such as a plastic, for example. Adjacent contacts 211 that form a differential signal pair may jog toward or away from each other as they extend through the overmolded housing 215 in order to maintain a substantially constant differential impedance profile between the contacts that form the pair. For arrangement into columns, the contacts 211 may be disposed along a length of the overmolded housing 215 (e.g., along the "Y" direction as shown in FIG. 2).

The contacts 211 may be dual beam receptacle contacts, for example. Such a dual beam receptacle contact may be adapted to receive a complementary beam contact during mating with an electrical device. As shown in FIG. 2, each contact 211 may have a dual beam receptacle portion 217 and a terminal portion 216. The terminal portion 216 may be adapted to receive a solder ball 120 as described below.

An IMLA 115 may also include one or more containment tabs 204. In an example embodiment, a respective tab 204 may be disposed on each end of the IMLA 115. For example, the contact 211 at the end of the IMLA 115 may have a tab 204 that extends beyond a face of the overmolded housing 215. In such an embodiment, the tab 204 may be made of the same material as the contact 211 (e.g., electrically conductive material). Alternatively, the tabs 204 may extend from the overmolded housing 215, and may be attached to the overmolded housing 215 or integrally formed with the overmolded housing 215. In such an embodiment, the tab 204 may be made of the same material as the overmolded housing 215 (e.g., electrically insulating material).

Figure 3:
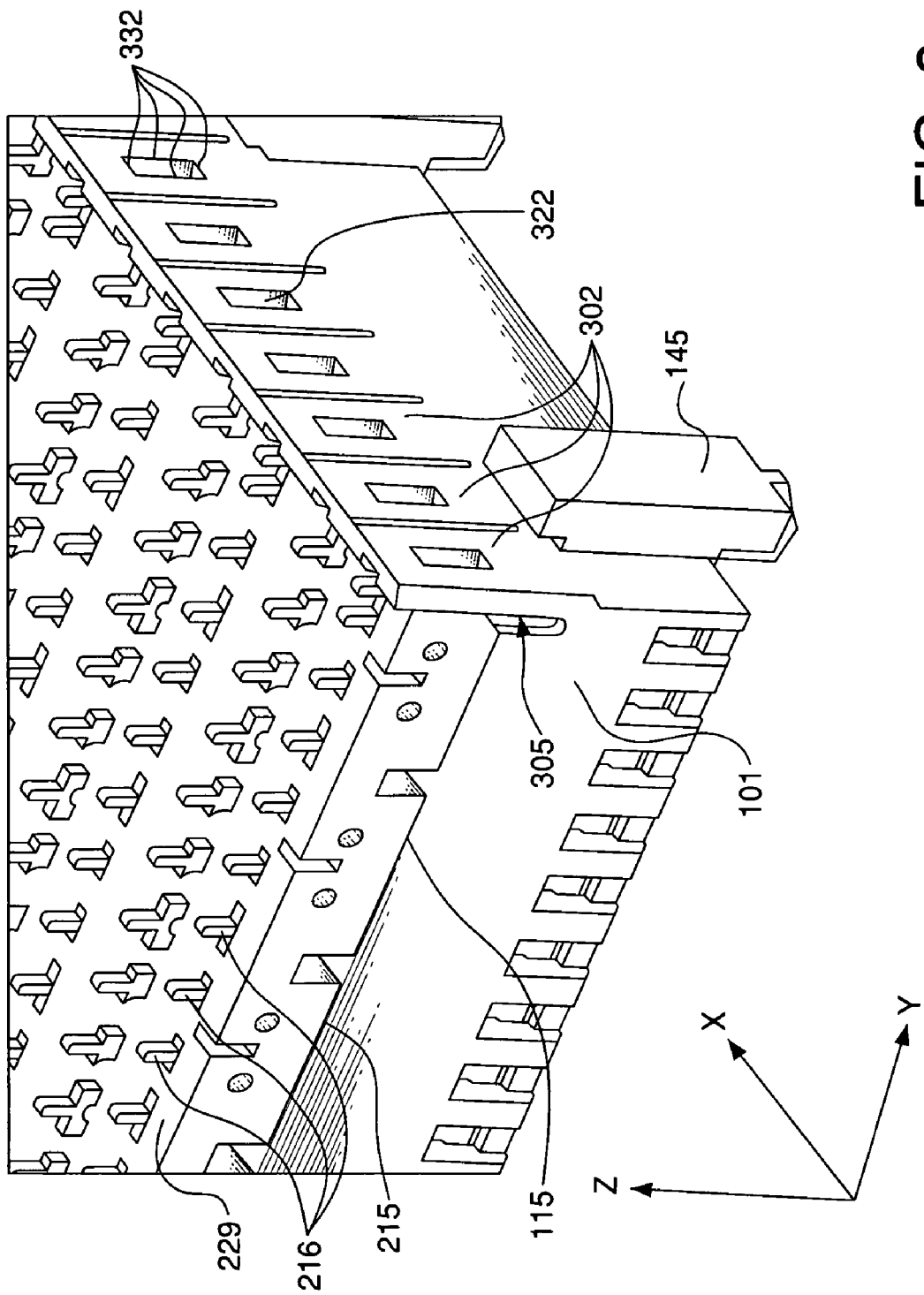
FIG. 3 provides a partial view of an example embodiment of a ball grid array connector according to the invention, without a wafer or solder balls.

As best seen in FIG. 3, the connector housing 101 may include one or more tab receptacles 302. In an example embodiment, a respective pair of tab receptacles 302 are arranged on opposite sides of the housing 101 to contain an associated IMLA 115 in a first direction (such as the Y-direction shown in FIG. 3). Each tab receptacle 302 may have an opening 322 for receiving a respective tab 204. Each such opening may be defined by a plurality of faces 332 formed within the tab receptacle. The tab receptacles 302 may be resilient so that they may be displaced enough to insert the associated IMLA 115 into the housing 101. With the IMLA 115 inserted into the housing 101, the tab receptacle 204 may snap back, and thus, the tabs 204 may be set within the openings 322 in the tab receptacles 302. According to an aspect of the invention, the tab receptacles 302 may contain the IMLAs within the housing in all directions, and also allow for movement of the IMLAs 115 in all directions within the housing.

To allow movement of the IMLAs 115 in the Y-direction, the lead frames 215 need not extend all the way to the inner surface 305 of the tab receptacle 302. When an end of the overmolded housing 215 meets the inner surface 305 of the associated tab receptacle 302, the tab receptacle 302 prevents the overmolded housing 215 from moving any further in the Y-direction. The distance the IMLA 115 may move relative to the housing 101 in the Y-direction may be controlled by regulating the distance between the end of the overmolded housing 215 and the inner surface 305 of the housing 101. Thus, the tab receptacles 302 may contain the IMLAs 115 in the Y-direction within the housing 101, while allowing movement of the IMLAs in the Y-direction.

To allow movement of the IMLA 115 relative to the housing 101 in the X- and Z-directions, the receptacle openings 322 may be made slightly larger than the cross-section (in the X-Z plane) of the tabs 204 that the openings 322 are adapted to receive. When the tab 204 meets one of the faces 332, the face 332 prevents the tab 204 (and, therefore, the overmolded housing 215) from moving any farther in whichever direction the IMLA 115 is moving (e.g., the X- or Z-direction). The relative difference in size between the receptacle opening 322 and the cross-section of the tab 204 determines the amount the IMLA 115 may move relative to the housing 101 in the X- and Z-directions. Thus, the tab receptacles 302 may contain the IMLAs 115 in the X- and Z-directions, while allowing movement of the IMLAs in the X-Z plane.

In an example embodiment of the invention, the tabs 204 may have dimensions of about 0.20 mm in the X-direction and about 1.30 mm in the Z-direction. The receptacle openings 322 may have dimensions of about 0.23 mm in the X-direction and about 1.45 mm in the Z-direction. The distance between each end of the overmolded housing 215 and the respective inner surface 305 of the housing 101 may be about 0.3 mm.

Figure 1:
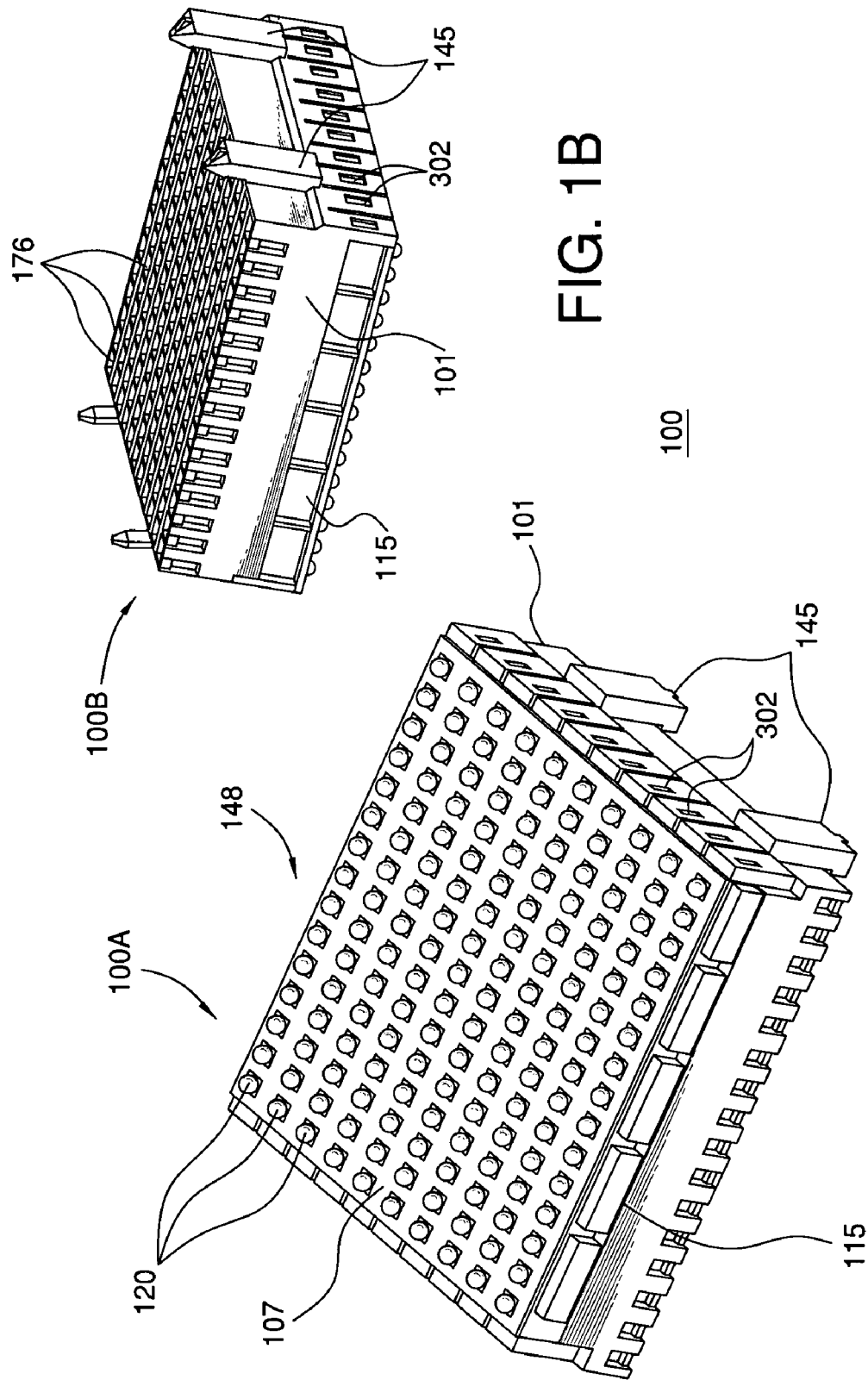
FIGS. 1A and 1B depict an example embodiment of a connector according to the invention.

As shown in FIG. 1, a connector 100 according to the invention may include a ball grid array 148. The ball grid array 148 may be formed by forming a respective solder ball 120 on the terminal end 216 of each of the electrical contacts 211. Thus, the ball grid array connector 100 may be set on a substrate, such as a printed circuit board, for example, having a pad array that is complementary to the ball grid array 148.

According to an aspect of the invention, the connector 100 may include a contact receiving substrate or wafer 107 that contains the terminal ends of the contacts, while allowing for movement of the terminal ends. The wafer 107 may be made of an electrically insulating material, such as a plastic, for example.

Figure 4:
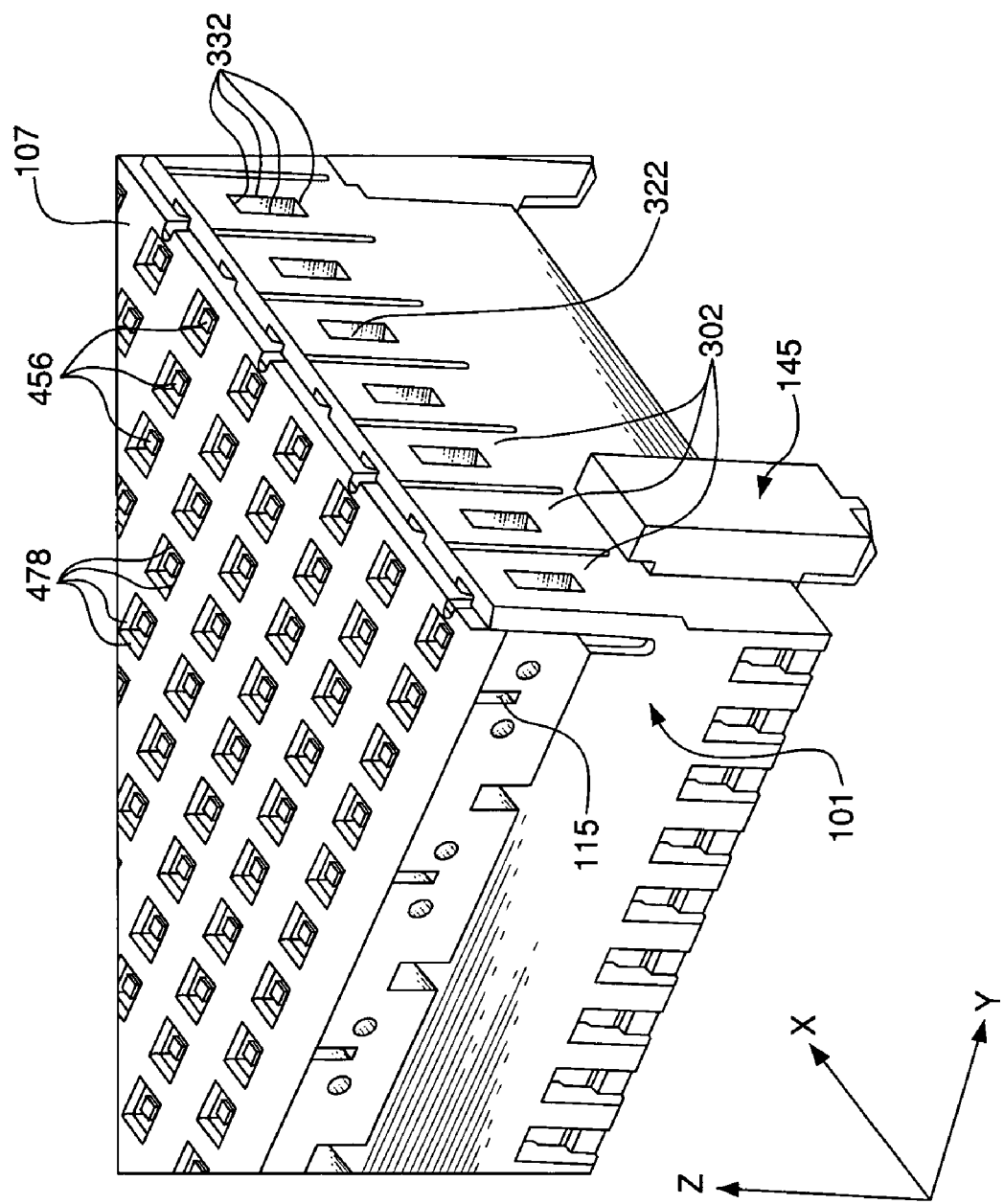
FIG. 4 provides a partial view of an example embodiment of a ball grid array connector according to the invention, without solder balls.

As best seen in FIG. 4, the wafer 107 may include an array of apertures 456. Each aperture 456 may receive a respective terminal portion 216 of a respective contact 211. Each aperture 456 is defined by a respective set of faces 478 that contain the terminals in the X- and Y-directions. To allow movement of the terminals in the X- and Y-directions, the apertures 456 may be slightly larger than the cross-section (in the X-Y plane) of the terminals 216 that the apertures 456 are adapted to receive. As shown, the faces 478 may define the aperture 456 such that at least one of the faces has a length that is greater than the width of the contact. Thus, the terminal portion of the contact may sit freely, or "float," within the aperture 456. That is, the terminal portion of the contact need not necessarily touch any of the faces that define the aperture 456. The relative difference in size between the aperture 456 and the terminal 216 determines the amount the terminal may move in the X- and Y-directions. Thus, the wafer 107 may contain the terminal portions 216 of the contacts 211 in the X- and Z-directions, while allowing movement of the terminal portions 216 in the X-Y plane.

As shown, the apertures 456 may be generally square, though it should be understood that the apertures 456 may be defined to have any desired shape. In an example embodiment of the invention, the terminal portions 216 of the contacts 211 may have dimensions of about 0.2 mm by about 0.3 mm. The apertures 456 may have dimensions of about 0.6 mm by about 0.6 mm.

Figure 5:
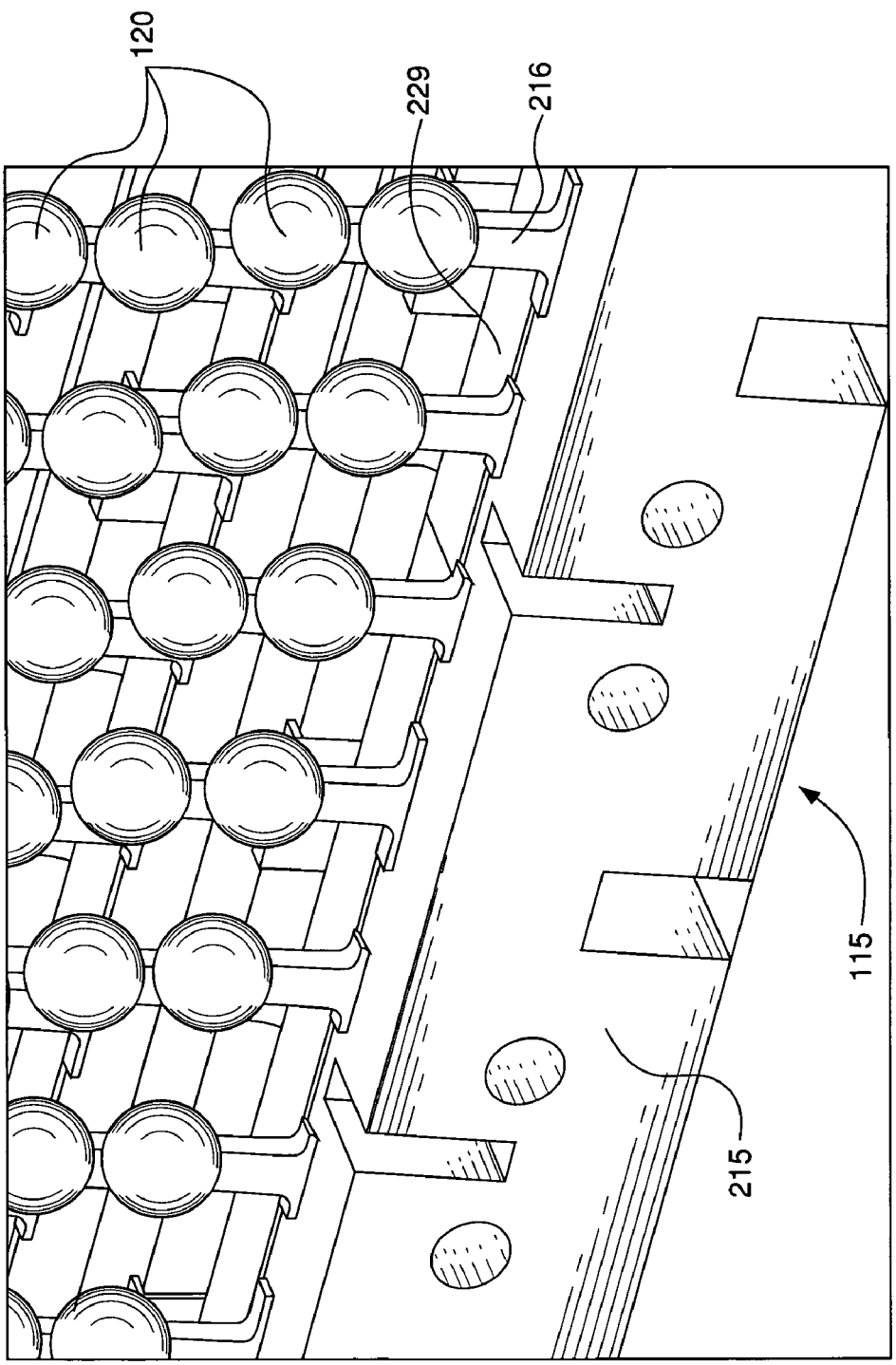
FIG. 5 provides a partial view of a ball grid array formed on a plurality of electrical contacts, without a wafer.

To manufacture the connector 100, the IMLAs 115 may be inserted and latched into the housing 101 as described above. The wafer 107 may then be set on the ball-side faces 229 of the overmolded housing 215, with the terminal portions 216 of the contacts 211 extending into the apertures 456. Respective solder balls 120 may then be formed on the terminal portions 216 of the contacts 211 using known techniques. FIG. 5 depicts a plurality of solder balls 120 formed on respective terminal portions 408 of contacts that extend through overmolded housing 215. Note that FIG. 5 depicts the connector with solder balls but without the wafer, though it is contemplated that the wafer will be set onto the lead frames before the solder balls 120 are formed.

To form a solder ball on a terminal end of the contact, solder paste may be deposited into the aperture 456 into which the terminal end of the contact extends. A solder ball may be pressed into the solder paste against the surface of the wafer 107. To prevent the contact from being pulled into the housing through the aperture, the diameter of the solder ball may be greater than the width of the aperture. The connector assembly (which includes at least the contact in combination with the housing and the wafer) may be heated to a temperature that is greater than the liquidous temperature of the solder. This causes the solder to reflow, form a generally spherically shaped solder mass on the contact tail, and metallurgically bond the solder ball to the contact.

Preferably, the aperture 456 has a width that is less than the diameter of the solder ball so that the solder ball prevents the contact from being able to be pulled into the housing. Similarly, the diameter of the solder ball being greater than the width of the aperture enables the wafer 107 to be contained between the solder balls 120 and the overmolded housings of the lead frame assemblies.

Figure 6:
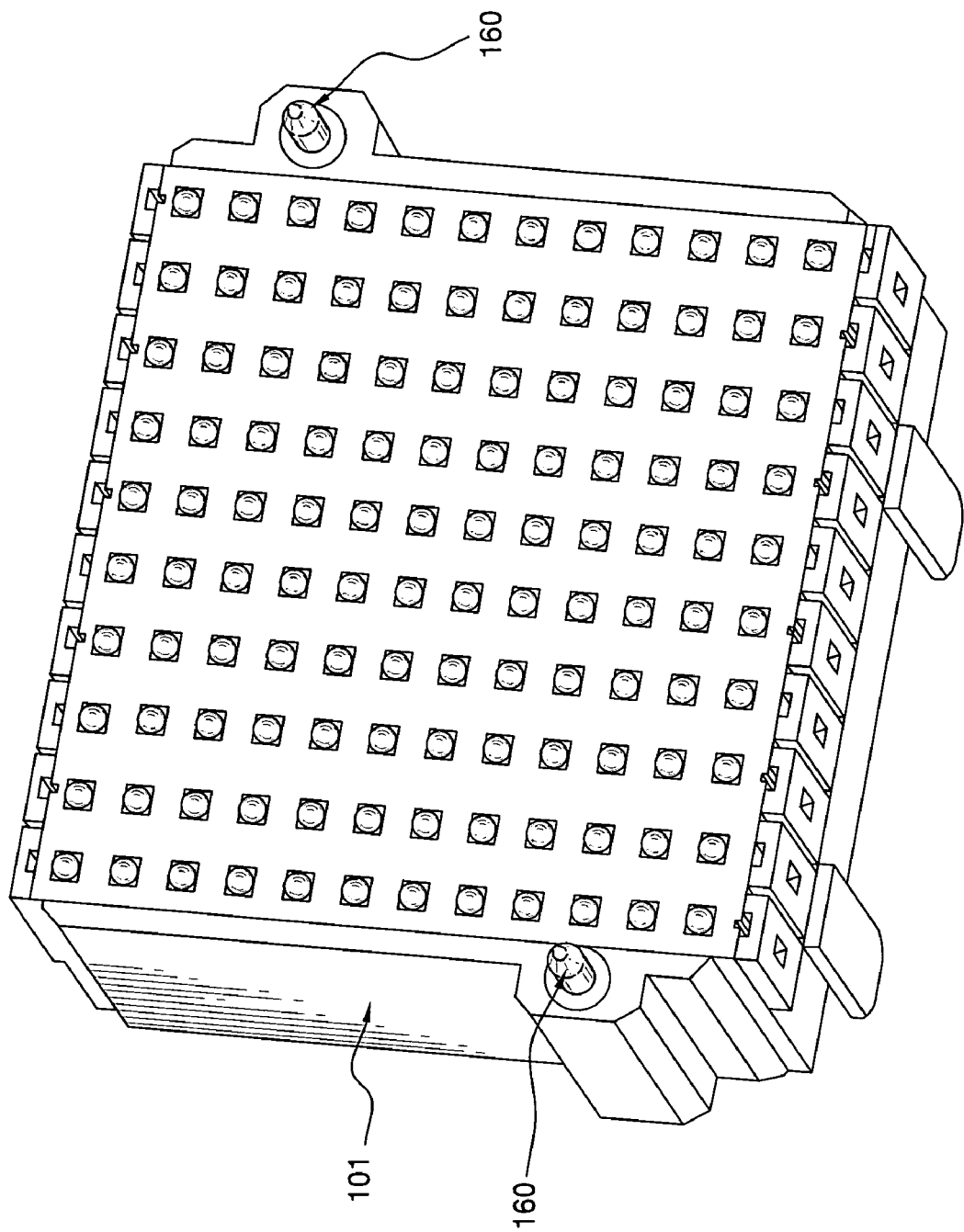
FIG. 6 provides a perspective bottom view of a connector according to the invention with solder posts attached to a housing.

As shown in FIG. 6, the connector housing 115 may also include one or more solder posts 160. The solder posts 160, which may contain solder or solderable surfaces, may be adapted to be received in orifices defined by a PCB board.

The IMLAs may be free to move with respect to the housing 115, as described above, prior to reflow of the solder balls. This movement, or float, allows the IMLAs to self-align during reflow of the solder balls. For example, when the solder balls liquefy during reflow, surface tension in the liquid solder produces a self-aligning effect. The present invention allows the IMLAs to benefit from the self-aligning properties of the liquid solder balls. Once reflow is complete, the contacts, housing, and solder posts are fixed with respect to the PCB. The affixed solder posts help prevent forces acting on the housing, in a direction parallel to the PCB, to transmit to the solder balls.

It is to be understood that the foregoing illustrative embodiments have been provided merely for the purpose of explanation and are in no way to be construed as limiting of the invention. Words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods, and uses, such as are within the scope of the appended claims. Those skilled in the art, having the benefit of the teachings of this specification, may affect numerous modifications thereto and changes may be made without departing from the scope and spirit of the invention in its aspects.

What is claimed:

1. An electrical connector comprising:
a connector housing that defines an internal cavity; and
a leadframe assembly positioned within the internal cavity defined by the connector housing, the leadframe assembly comprising an electrical contact extending at least partially through an overmolded leadframe housing,
wherein the leadframe assembly and the connector housing are adapted to be free to move in each of two opposite directions with respect to each other when the connector is assembled for use, wherein the contact has a first terminal end to mate with a complementary contact of a second electrical connector, and wherein the contact has a second terminal end to attach to a substrate.

2. The electrical connector of claim 1, wherein the housing is free to move in two opposite directions with respect to the leadframe assembly after the electrical contact is connected to a substrate.

3. The electrical connector of claim 1, wherein the leadframe housing is made of an electrically insulating material.

4. The electrical connector of claim 1, further comprising a wafer that defines at least one electrical contact receiving aperture, wherein the electrical contact receiving aperture receives the electrical contact and is defined at least in part by a face having a width that is greater than a width of the electrical contact.

5. The electrical connector as claimed in claim 4, wherein the wafer is attached to the connector housing, and wherein the wafer and the leadframe assembly are free to move in each of two opposite directions with respect to each other.

6. The electrical connector as claimed in claim 4, wherein the wafer is attached to the connector housing, and wherein the connector housing and the wafer are free to move, as a single unit, in each of two opposite directions with respect to the leadframe assembly after the electrical contact is attached to a substrate.

7. The electrical connector of claim 1, wherein the connector housing contains the leadframe assembly in a second direction and allows the leadframe assembly to move relative to the connector housing in the second direction.

8. The electrical connector of claim 7, wherein the second direction is orthogonal to each of the two opposite directions.

9. The electrical connector of claim 7, wherein the connector housing contains the leadframe assembly in a third direction and allows the leadframe assembly to move relative to the connector housing in the third direction.

10. The electrical connector of claim 9, wherein the third direction is orthogonal to each of the two opposite directions.

11. The electrical connector of claim 10, wherein the third direction is orthogonal to the second direction.

12. The electrical connector of claim 1, wherein the leadframe assembly comprises a plurality of electrical contacts extending at least partially through the leadframe housing.

13. The electrical connector of claim 12, wherein the plurality of electrical contacts are disposed in a linear array.

14. The electrical connector of claim 1, wherein the leadframe assembly includes a tab extending therefrom via which the leadframe assembly is contained by the connector housing.

15. The electrical connector of claim 14, wherein the tab extends from the leadframe housing.

16. The electrical connector of claim 14, wherein the tab extends from the electrical contact.

17. The electrical connector of claim 14, wherein the connector housing comprises a tab receptacle that defines an opening into which the tab extends.

18. The electrical connector of claim 17, wherein the opening is larger than a cross-sectional area of the tab.

19. The electrical connector of claim 17, wherein the tab receptacle is resilient.

20. An electrical connector comprising:
an electrical contact extending at least partially through a leadframe housing; and
a connector housing adapted to contain the leadframe housing in a first direction and allow the leadframe housing to move relative to the connector housing in the first direction after the connector is attached to a substrate, wherein the contact extends through the connector and has a first terminal end adapted to mate with a complementary contact of a second electrical connector, and has a second terminal end adapted to attach to the substrate.

21. The electrical connector of claim 20, wherein the connector housing contains the electrical contact in a second direction and allows the electrical contact to move relative to the connector housing in the second direction.

22. The electrical connector of claim 21, wherein the second direction is orthogonal to the first direction.

23. The electrical connector of claim 21, wherein the connector housing contains the electrical contact in a third direction and allows the electrical contact to move relative to the connector housing in the third direction.

24. The electrical connector of claim 23, wherein the third direction is orthogonal to the first direction.

25. The electrical connector of claim 24, wherein the third direction is orthogonal to the second direction.

26. A housing for an electrical connector, the housing comprising:
a tab receptacle adapted to contain a leadframe assembly in a first direction, the receptacle having an opening for receiving a tab that extends from the leadframe assembly such that the tab receptacle is adapted to allow the leadframe assembly to move in the first direction after the leadframe assembly is fully received in the housing, wherein the leadframe assembly comprises an electrical contact adapted such that, when the leadframe assembly is fully received in the housing, a first terminal end of the contact is positioned to mate with a complementary contact of a second electrical connector and a second terminal end of the contact is positioned to attach to a substrate.

27. An electrical connector comprising:
a connector housing that defines an internal cavity; and
a leadframe assembly positioned within the internal cavity defined by the connector housing, the leadframe assembly comprising an electrical contact extending at least partially through an overmolded leadframe housing, and
a wafer that defines at least one electrical contact receiving aperture, wherein the electrical contact receiving aperture receives the electrical contact and is defined at least in part by a face having a width that is greater than a width of the electrical contact,
wherein the leadframe assembly and the connector housing are free to move in each of two opposite directions with respect to each other.

28. The electrical connector of claim 27, wherein the connector housing is free to move in two opposite directions with respect to the leadframe assembly after the electrical contact is connected to a substrate.

29. The electrical connector as claimed in claim 27, wherein the wafer is attached to the connector housing, and wherein the wafer and the leadframe assembly are free to move in each of two opposite directions with respect to each other.

30. The electrical connector as claimed in claim 27, wherein the wafer is attached to the connector housing, and wherein the connector housing and the wafer are free to move, as a single unit, in each of two opposite directions with respect to the leadframe assembly after the electrical contact is attached to a substrate.

31. The electrical connector of claim 27, wherein the leadframe housing is made of an electrically insulating material.

32. The electrical connector of claim 27, wherein the leadframe assembly comprises a plurality of electrical contacts extending at least partially through the leadframe housing.

33. The electrical connector of claim 32, wherein the plurality of electrical contacts are disposed in a linear array.

34. The electrical connector of claim 27, wherein the connector housing contains the leadframe assembly in a second direction and allows the leadframe assembly to move relative to the connector housing in the second direction.

35. The electrical connector of claim 34, wherein the second direction is orthogonal to the first direction.

36. The electrical connector of claim 34, wherein the connector housing contains the leadframe assembly in a third direction and allows the leadframe assembly to move relative to the connector housing in the third direction.

37. The electrical connector of claim 36, wherein the third direction is orthogonal to the first direction.

38. The electrical connector of claim 37, wherein the third direction is orthogonal to the second direction.

39. The electrical connector of claim 27, wherein the leadframe assembly includes a tab extending therefrom via which the leadframe assembly is contained by the connector housing.

40. The electrical connector of claim 39, wherein the tab extends from the leadframe housing.

41. The electrical connector of claim 39, wherein the tab extends from the electrical contact.

42. The electrical connector of claim 39, wherein the connector housing comprises a tab receptacle that defines an opening into which the tab extends.

43. The electrical connector of claim 42, wherein the opening is larger than a cross-sectional area of the tab.

44. The electrical connector of claim 42, wherein the tab receptacle is resilient.

* * * * *